United States Patent [19]

Okubi et al.

[11] Patent Number: 4,830,880
[45] Date of Patent: May 16, 1989

[54] FORMATION OF CATALYTIC METAL NUCLEI FOR ELECTROLESS PLATING

[75] Inventors: Kenichi Okubi; Tatsuya Nogami; Makoto Takakura, all of Funabashi, Japan

[73] Assignee: Nissan Chemical Industries Ltd., Tokyo, Japan

[21] Appl. No.: 171,223

[22] Filed: Mar. 22, 1988

Related U.S. Application Data

[63] Continuation of Ser. No. 38,644, Apr. 15, 1987, abandoned.

[30] Foreign Application Priority Data

Apr. 22, 1986 [JP] Japan .................................. 61-92994

[51] Int. Cl.⁴ .......................... B05D 3/04; B05D 5/12
[52] U.S. Cl. ...................................... 427/229; 427/97; 427/98; 427/306; 427/443.1
[58] Field of Search ..................... 427/97, 98, 229, 306

[56] References Cited

U.S. PATENT DOCUMENTS

| | | |
|---|---|---|
| 3,523,824 | 8/1970 | Powers et al. |
| 3,900,320 | 8/1975 | Rolker et al. ........................... 204/30 |
| 3,937,857 | 2/1976 | Brumett ................................. 427/98 |
| 4,317,856 | 3/1982 | Huthwelker ........................... 427/97 |
| 4,368,281 | 1/1983 | Brumett ................................. 427/98 |
| 4,493,861 | 1/1985 | Sirinyan ............................... 427/306 |
| 4,585,502 | 4/1986 | Uozu ..................................... 427/97 |
| 4,622,069 | 11/1986 | Akai ..................................... 427/229 |
| 4,663,240 | 5/1987 | Hajdu ................................. 427/443.1 |
| 4,716,050 | 12/1987 | Green et al. ........................... 427/99 |
| 4,717,587 | 1/1988 | Suhr et al. ............................ 427/306 |
| 4,719,145 | 1/1988 | Neely ..................................... 427/98 |
| 4,764,401 | 8/1988 | Sirinyan et al. ....................... 427/306 |

FOREIGN PATENT DOCUMENTS 2154711 5/1973 France .
1394165 5/1975 United Kingdom ................ 427/306

OTHER PUBLICATIONS

IBM Technical Disclosure Bulletin, vol. 11, No. 8, Jan. 1969, p. 1001, Bailey et al: "Catalysis for electroless copper plating".

Primary Examiner—Norman Morgenstern
Assistant Examiner—M. L. Padgett
Attorney, Agent, or Firm—Oblon, Fisher, Spivak, McClelland & Maier

[57] ABSTRACT

An electroless plating method which comprises applying to a substrate a polymer composition comprising 100 parts by weight of a polymer and an organic metal complex in an amount of from 0.001 to 50 parts by weight as metal, pyrolytically decomposing the organic metal complex at a temperature of from 50° to 500° C. to form plating catalyst metal nuclei on the substrate, removing the dried polymer coating, and conducting electroless plating of the substrate.

6 Claims, 2 Drawing Sheets

FORMATION OF CATALYTIC METAL NUCLEI FOR ELECTROLESS PLATING

This application is a continuation Ser. No. 038,644, filed on Apr. 15, 1987 now abandoned.

BACKGROUND OF THE INVENTION

The present invention relates to an electroless plating method. More particularly, it relates to a technique for forming plating catalyst metal nuclei on a substrate for electroless plating.

An electroless plating method is relatively simple as a method for forming a metal conductive coating layer and suitable for mass production, and if necessary, electrolytic plating may be applied after the electroless plating. Thus, electroless plating is widely used in various fields for functional and decorative applications.

Further, in recent years, high densification is required for printed circuits reflecting an increasing tendency for small sizes of electric and electronic devices, and printed circuit boards have been developed in favour of through hole substrates or mass lamination substrates.

The plating of through holes has been conducted by a panel plating method or a pattern plating method by means of electrolytic plating. By such a method, however, the process is cumbersome. In a case where the aspect ratio is high as in the case of the through holes of a mass lamination substrate, an attention has been drawn to an electroless plating method in order to improve the uniformity of the conductive coating layer in the through holes, and electroless plating has been practically employed to some extent.

By the applicaion of electroless plating to plastic materials, it is possible not only to improve the heat resistance, rigidity and surface hardness of the plastic materials, but also to impart a metallic gloss and metallic properties to the surface of the plastic materials. Therefore, such electroless plating is preferably used for the production of home electrical appliances, interior or exterior parts of automobiles, office appliances and general industrial appliances.

Printed circuit boards rapidly developed in recent years, are usually prepared by a process wherein a copper foil formed on a paper substrate, on a thermoset plastic substrate made of e.g. a glass fiber-reinforced phenol resin or epoxy resin, or on a flexible substrate made of e.g. polyimide, polyester or polysulfone, is removed at unnecessary portions. An attention has been drawn to an electroless plating method with a view to simplification of the process and improvement of the circuit properties.

Further, the electroless plating method is expected to be further developed for a so-called electro magnetic shielding technique whereby electric conductivity is imparted to the casings for electronic devices to eliminate erroneous operation of a degital circuit due to electromagnetic waves, since the resulting metal conductive coating layer is extremely thin, light in weight and excellent in the shielding effect, as compared with other methods for providing conductivity, such as a metal flame spraying method or an electro-conductive painting coating method.

The electroless plating method usually comprises a surface treatment step such as degreasing of the substrate, a surface roughening step to improve the adhesive strength of the plated layer, a step of forming plating catalyst metal nuclei, a step of washing with water and an electroless plating step.

In the step of forming plating catalyst metal nuclei, the substrate is dipped in a solution of an activating agent. The activating agent solution may be an aqueous stannous salt solution or an aqueous palladium chloride solution in a case where the substrate is a non-conductive material such as a plastic material. It may be an acidic aqueous solution containing stannous chloride and palladium chloride in a case where the substrate has non-conductive and conductive surfaces.

When it is desired to partially apply electroless plating as in the case of an additive method printed circuit board, only the desired portions will be activated. As such a method, there is a method wherein an ink composed of a resin adhesive containing a metal such as nickel or palladium, or a salt thereof, is coated on predetermined portions of a substrate, followed by dipping in a plating bath for plating, or a method as disclosed in Japanese Unexamined Patent Publication No. 88891/1984 (U.S. Pat. No. 4,368,281) wherein an ink composed of a resin adhesive containing an organic metal complex of e.g. nickel, palladium or platinum, is coated on a substrate, followed by heating or dipping in a specific reducing agent, and then by plating.

Further, there is a method wherein the entire surface of a substrate is activated, and the portions of the substrate where no plating is required, are covered with a plating resist, follwod by electroless plating, and then by the removal of the plating resist.

When a conductive coating layer is to be formed in through holes solely by electroless plating, plating catalyst metal nuclei will be deposited by a dipping method.

Namely, for the preparation of a circuit board, plating catalyst metal nuclei are deposited on the entire surface of a copper-clad laminate, then the necessary circuit portions are masked with a dry film resist, and the unnecessary copper foil is removed by etching, followed by electroless plating.

In the conventional electroless plating method, the activating agent for forming plating catalyst metal nuclei is in the form of a solution, and a substrate is dipped therein, whereby a special rack or the like is required, and it is difficult to make this step a continuous process.

Further, when a conductive coating layer in the through holes is to be formed solely by electroless plating, palting catalyst metal nuclei will be formed by a dipping method, whereby it is difficult to make the step continuous.

When an activating agent such as a combination of an aqueous stannous salt solution and an aqueous palladium chloride solution, or an acidic aqueous solution comprising stannous chloride and palladium chloride, is used, tin ions are like to remain on the substrate surface, which adversely affect the physical properties of the metal conductive coating layer formed by electroless plating.

In the method where an ink composed of an adhesive resin containing a metal such as nickel or palladium, or salt thereof, or an ink disclosed in Japanese Unexamined Patent Publication No. 88891/1984 (U.S. Pat. No. 4,368,281) is used to activate only the desired portions in order to apply electroless plating only to the desired portions, a metal conductive coating layer is formed on an adhesive resin, whereby the inherent properties of the substrate itself are likely to be impaired.

In the method wherein electroless plating is applied while covering the portions of the substrate where no plating is required, with a plating resist, an expensive palladium metal in the activating agent is deposited on the portions where no plating is required, such being uneconomical, and cumbersome steps such as the coating and peeling of the plating resist are required. When such a method is applied for the production of a printed circuit board, palladium metal is likely to remain between circuits, whereby the dependability in e.g the withstand voltage of the circuits tends to be poor.

The method in which the dry film resist is employed, has a drawback that the dry film resist is expensive, and a high level of technique is required for the step of masking the necessary circuit portions, and this method is not useful for landless through holes (bia holes) which are commonly employed in recent years.

SUMMARY OF THE INVENTION

The present inventors have conducted extensive research to solve the above-mentioned drawbacks, and as a result, have found that when a polymer composition containing an organic metal complex capable of freeing a metal having a catalytic activity for electroless plating, is coated on the portions of the substrate where plating is desired, and subjected to heat treatment, and the dried coating of the polymer is physically or chemically removed, a part of metal is freed and firmly deposits as plating catalyst metal nuclei at the portions of the substrate where the polymer composition is coated, and the metal nuclei constitute active sites for the subsequent electroless plating.

The present invention has been accomplished on the basis of this discovery.

Thus, the present invention provides an electroless plating method which comprises applying to a substrate a polymer composition comprising 100 parts by weight of a polymer and an organic metal complex in an amount of from 0.001 to 50 parts by weight as metal, pyrolytically decomposing the organic metal complex at a temperature of from 50° to 500° C. to form plating catalyst metal nuclei on the substrate, removing the dried polymer coating, and conducting electroless plating of the substrate.

Now, the present invention will be described in detail with reference to the preferred embodiment.

BRIEF DESCRIPTION OF THE DRAWINGS

In the accompanying drawings.

Figure 1:
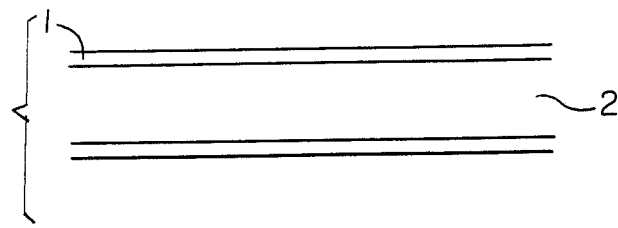
FIGS. 1 to 8 illustrate a process for the production of a printed circuit board as described in Example 12 wherein the present invention is employed.

In the present invention, the application of the polymer composition means not only usual coating but also filling in through holes having small diameters.

The organic metal complex to be used in the present invention is a compound which is stable against oxgen and moisture at room temperature and which is capable of liberating metal when heated.

The metal may be selected from the group consisting of metals of Groups Ib and VIII of the Periodic Law Table. Particularly preferred are cobalt, nickel, palladium, copper and platinum.

The ligand of the organic metal complex may be at least one ligand selected from the group consisting of a tertiary phosphine, tertiary phosphite, carbon monoxide, a straight chain or cyclic olefin, a conjugated olefin, an aryl compound, an organic cyano compound, an organic isonitrile compound, a carbonyl compound, an organic mercapto compound, a heterocyclic compound, a compound having an alkly group, a vinyl group, an allyl group, an aryl group, an ethylidyne group, an acyl group, an acyloxy group or an amino group, a halogen atom, an oxygen atom and a nitrogen atom.

The polymer to be used in the present invention is required to have at least one of the following characteristics, since the dried coating other than the plating metal catalyst metal nuclei formed on the substrate, must be removed after the plating catalyst metal nuclei have been formed on the substrate.

(1) It can readily be peeled off from the substrate.

(2) It is readily soluble in an organic solvent or in an aqueous alkaline solution.

Further, since the organic metal complex must be uniformly dissolved or dispersed, the polymer is selected from liquid polymers or polymers soluble in organic solvents.

Specifically, such a polymer is preferably selected from the group consisting of polystyrene, polyvinyl chloride, polysulfone, polycarbonate, polyacrylate, polyurethane, polyamide, a saturated or unsaturated polyester, an epoxy resin, a silicone resin, a diallyl phthalate resin, a cellulosic plastic, a rosin-modified maleic acid resin, and copolymers thereof.

The polymers may be used alone or in combination as a blend.

Such a polymer may be used in any form such as in the form of powder, granule, block or solution.

The polymer composition containing the organic metal complex of the present invention is required to have the organic metal complex and the polymer uniformly mixed, and is usually prepared in the following manner.

When the polymer is solid, there may be employed a method wherein a solution of the polymer in an organic solvent is mixed with an organic metal complex, or a method wherein a solution of the polymer in an organic solvent is mixed with a solution of the organic metal complex in an organic solvent.

When the polymer is liquid, the organic metal complex may directly be added to the polymer and mixed. However, it is preferred to employ an organic solvent in view of the operation efficiency and the uniformity of the resulting polymer composition.

The polymer composition containing the organic metal complex comprises 100 parts by weight of the polymer and the organic metal complex in an amount of from 0.001 to 50 parts by weight as metal, and its viscosity is adjusted to a level of from a few centipois to a few hundred thousands centipois by using an organic solvent or an additive.

There is no particular restriction as to the organic solvent to be used in the present invention. However, when the substrate is a plastic material, it is necessary to select a solvent so that it does not dissolve or swell the substrate.

For example, the organic solvent may be hexane, cyclohexane, ethyl ether, dioxane, ethylcellosolve, butylcellosolve, ethylene glycol, chloroform, carbon tetrachloride, dichloroethane, trichloroethane, methyl ethyl ketone, benzene, toluene, xylene, ethyl acetate, methyl alcohol, ethyl alcohol, isopropyl alcohol, acetone, pyridine, acetonitrile, dimethylformamide or dimethylsulfoxide.

The organic solvent may be composed of a single solvent or a solvent mixture of two or more different solvents.

As the additive, a pigment such as carbon black, talc, silica or barium sulfate, an anti-foaming agent or surfactant, may be mentioned. Further, a reducing agent or a radical generating agent capable of liberating plating catalyst metal nuclei from the organic metal complex, may also be mentioned as an additive.

The polymer composition containing the organic metal complex can be prepared by using a usual mixing machine, such as a stirring vain mixer, a honomixer, a henschel mixer, a ball mill, a sand mill or a roll mill.

Now, the electroless plating method wherein the polymer composition containing the organic metal complex of the present invention, will be described in detail.

The polymer composition containing the organic metal complex can be applied to the substrate by means of various coating methods depending upon the viscosity of the polymer composition. The coating methods include dip coating, spin coating, spray coating, doctor blade coating, bar coating, brushing, screen printing and roll coating.

When it is desired to partially apply the electroless plating, there may be employed a method wherein the polymer composition containing the organic metal complex is partially coated by a printing method, or a method wherein the substrate surface is coated with a suitable masking material, and the polymer composition containing the organic metal complex is applied, or a method wherein the polymer composition containing the organic metal complex is filled in recesses or through holes.

In the present invention, the substrate must be adequeately dried prior to the application of the polymer composition containing the organic metal complex.

However, no other special pretreatment of the substrate is required, and a usual treatment such as degreasing of the substrate or surface roughening treament may be applied as the case requires.

The substrate may be made of plastics, glass, ceramics, wood, cellulose, paper or metal.

The substrate coated with the polymer composition containing the organic metal complex, is then dried and subjected to heat treatment.

The drying operation should be carefully conducted so that the polymer composition containing the organic metal complex will not foam. If foaming takes place, the adhesion of the polymer composition containing the organic metal complex with the substrate tends to be poor, whereby plating catalyst metal nuclei will not deposit uniformly.

The drying temperature is selected to be at a level where a low boiling point component such as an organic solvent in the polymer composition containing the organic metal complex will evaporate, which is usually within a range of from 15° to 250° C.

The substrate coated with the dried polymer composition containing the organic metal complex, is then subjected to heat treatment.

The temperature for the heat treatment is selected to be at a level where plating catalyst metal nuclei are liberated and deposit by the pyrolytic decomposition of the organic metal complex.

Therefore, it is not necessarily required to employ the heat decomposition temperature of the organic metal complex. Namely, the heat treatment is conducted usually within a range of from 50° to 500° C., preferably from 80° to 350° C.

The heating time is usually from a few minutes to a few tens minutes at the above-mentioned temperature.

The heat treatment temperature can be lowered or the time can be shortened by using a reducing agent or a radical generating agent capable of liberating plating catalyst metal nuclei from the organic metal complex.

This heat treatment can be conducted inclusive of the above-mentioned drying.

The drying and heat treatment temperatures should be selected taking into consideration the drying of the substrate coated with the polymer composition containing the organic metal complex, the temperature for the liberation and deposition of plating catalyst metal nuclei from the organic metal complex and the heat resistance of the substrate.

As a method for removing from the substrate the dried coating other than the plating catalyst metal nuclei deposited on the substrate, a chemical method or a physical method may be employed. For the chemical method, a reagent solution capable of dissolving the major components of the dried coating such as the polymer and/or ligands of the organic metal complex and the pyrolytic products thereof, for instance, an organic solvent or an aqueous alkaline solution, is employed. As the organic solvent, the afore-mentioned organic solvents may be employed.

The dissolving method may be dipping in the reagent solution, shaking in the reagent solution or shower washing with the reagent solution. In such a case, even when a solid component such as a pigment is present in the dried coating, such a solid component can readily be transferred to the reagent solution. In the chemical method, the reagent solution must be inert to the substrate, and due care should be paid for the selection of the substrate and the polymer. Particularly when the substrate is a plastic material, it is necessary to pay a due care.

The physical method includes peeling, abrading, grinding and blasting the dried coating. In many cases, it is difficult to remove the dried coating by such a physical method, since it is usual that surface roughning treatment is preliminary applied to the substrate. Further, the physical method is likely to remove also the plating catalyst metal nuclei deposited on the substrate. Therefore, it is necessary to pay a due care when the physical method is employed.

After the removal of the major portion of the dried coating other than the plating catalyst metal nuceli from the substrate, the substrate is washed as the case requires and then subjected to electroless plating.

There is no particular restriction as to the electroless plating solution, and a usual eletroless plating solution comprising a reducing agent such as glucose or formalin may be used. As the metal for electroless plating, copper or nickel may be mentioned.

Further, after the electroless plating, electrolytic plating of copper, nickel, palladium or gold may be applied as the case requires.

In the present invention, a polymer composition containing an organic complex of a metal belonging to Group Ib or VIII of the Period Law Table, is used, whereby no tin ions remain on the surface of the substrate, and there will be no adverse effect to the physical properties of the metal conductive coating layer formed by the electroless plating method.

Further, according to the present invention, catalytic nuclei can be formed at any desired portions, and it is necessary to deposit expensive metal such as palladium in the activating agent at the portion where no electroless plating is required. Thus, the present invention is economical, and cumbersome steps such as coating and peeling of a plating resist are not required. Thus, for the production of a printed circuit board, the dependability of e.g. the withstand voltage of the circuit can be improved.

Further, the major portion of the dried coating is removed from the substrate prior to the electroless plating, and no metal conductive coating layer is formed on the dried coating, whereby the inherent properties of the substrate can be utilized.

Furthermore, in a case where the dried coating is removed by an organic solvent or an aqueous alkaline solution, the entire plating step can be made continuous.

Likewise, the formation of a conductive coating layer in the through holes can continuously be conducted, and such a continuous process can be employed also for landless through holes (bia holes).

Now, the present invention will be described in detail with reference to Examples. However, it should be understood that the present invention is by no means restricted to these specific Examples.

EXAMPLE 1

From 0.005 to 0.1 part by weight of di-$\eta$-chloro-bis-($\mu$-2-methylallyl)dipalladium (II) as the organic metal complex, from 2 to 10 parts by weight of a polycarbonate (Iupilon S-2000, manufactured by Mitsubishi Gas Kagaku K.K.) as the polymer and 100 parts by weight of chloroform as the organic solvent, were uniformly mixed to obtain a polymer composition.

Into this composition, commercially available paper base phenolic resin laminate, paper base epoxy resin laminate and glass-cloth epoxy resin laminate, each having a thickness of 1.6 mm and provided with three sets of ten through holes having diameters of 1 mm, 1.8 mm and 2.5 mm, respectively, were dipped, and then dried at room temperature for 30 minutes and subjected to heat treatment at 170° C. for 10 minutes.

Then, each laminate was thoroughly washed with chloroform to dissolve and remove the polycarbonate, then washed with acetone and water, and thereafter immersed in an electroless copper plating bath (chemical copper #200, manufactured by Okuno Seiyaku Kogyo K.K.) at room temperature for 20 minutes whereby each laminate uniformly plated with chemical copper both at the surface and in the through holes was obtained.

All the through holes in each laminate were electrically conductive.

EXAMPLE 2

A polymer composition containing an organic metal complex was prepared in the same manner as in Example 1 except that 0.1 part by weight of di-$\eta$-chlorotetracarbonyl-dirhodium (II) was used as the organic metal complex, 10 parts by weight of the polycarbonate (Iupilon S-2000, manufactured by Mitsubishi Gas Kagaku K.K.) was used as the polymer.

Into this composition, a commercially available glass-cloth epoxy resin laminate having a thickness of 1.6 mm and provided with ten through holes having a diameter of 1 mm, was dipped, and the electroless plating was conducted in the same manner as in Example 1, whereby a glass-cloth epoxy resin laminate uniformly plated with chemical copper both at the surface and in the through holes, was obtained.

All the through holes in this laminate were electrically conductive.

EXAMPLE 3

The electroless plating was conducted in the same manner as in Example 2 except that 0.3 part by weight of bis(divenzylidenacetone)platinum (0) was used as the organic metal complex, whereby a glass-cloth epoxy resin laminate uniformly plated with chemical copper both at the surface and in the through holes, was obtained.

All the through holes in this laminate were electrically conductive.

EXAMPLE 4

The electroless plating was conducted in the same manner as in Example 2 except that 0.2 part by weight of benzylchlorobis(triphenylphosphine)palladium (II) was used as the organic metal complex, whereby a glass-cloth epoxy resin laminate uniformly plated with chemical copper both at the surface and in the through holes was obtained.

All the through holes in this laminate were electrically conductive.

EXAMPLE 5

The electroless plating was conducted in the same manner as in Example 2 except that 0.5 part by weight of dichlorobis(triethylphosphine)nickel (II) was used as the organic metal complex, whereby a glass-cloth epoxy resin laminate uniformly plated with chemical copper both at the surface and in the through holes was obtained.

All the through holes in this laminates were electrically conductive.

EXAMPLE 6

The electroless plating was conducted in the same manner as in Example 2 except that 1.0 part by weight of dichlorobis(tributylphosphine)copper (II) was used as the organic metal complex, whereby a glass-cloth epoxy laminate uniformly plated with chemical copper both at the surface and in the through holes was obtained.

All the through holes in this laminate were electrically conductive.

EXAMPLE 7

A polymer composition containing an organic metal complex was prepared in the same manner as in Example 1 except that 0.1 part by weight of di-$\eta$-chloro-bis-($\mu$-2-methylallyl)dipalladium (II) was used as the organic metal complex and 10 parts by weight of the polycarbonate (Iupilon S-2000, manufactured by Mitsubishi Gas Kagaku K.K.) was used as the polymer.

This composition was coated on one side of a commercially available glass-cloth epoxy resin laminate by means a bar coater, and adequately dried to obtain a coating layer having a thickness of 5 $\mu$m.

Then, heat treatment was conducted at 170° C. for 10 minute, and the laminate was treated in the same manner as in Example 1, whereby a glass-cloth epoxy resin laminate uniformly plated with chemical copper only at one side was obtained.

EXAMPLE 8

A polymer composition di-$\eta$-chloro-bis($\mu$-2-methylallyl)dipalladium (II) was prepared in the same manner as in Example 7 by using polysulphone (Udel polysulphone P-1700, manufactured by Nissan Chemical Industries Ltd. instead of the polycarbonate (Iupilon S-2000, manufactured by Mitsubishi Gas Kagaku K.K.) used in Example 7, and the electroless plating of a commercially available glass-cloth epoxy resin laminate was conducted in the same manner as in Example 1, whereby a glass-cloth epoxy resin laminate uniformly plated with chemical copper both at the surface and in the through holes was obtained.

EXAMPLE 9

Into the polymer composition containing di-η-chloro-bis(μ-2-methylallyl)dipalladium (II) of Example 7, a slide glass was dipped, and dried at room temperature, and then subjected to heat treatment at 170° C. for 10 minutes. Then, the polymer coating layer was peeled off.

Then, the electroless plating was conducted in the same manner as in Example 1, whereby a slide glass uniformly plated with chemical copper was obtained.

EXAMPLE 10

The operation was conducted in the same manner as in Example 9 except that an alumina substrate was used, whereby an alumina substrate uniformly plated with chemical copper was obtained.

EXAMPLE 11

A commercially available glass-cloth expoxy resin laminate with its surface roughened by sanding was coated with a plating masking tape (C-2500, manufactured by Okuno Seiyaku Kogyo K.K.) except for the portions to be plated.

This laminate was dipped into the polymer composition containing di-η-chloro-bis(μ-2-methylallyl)dipalladium (II) of Example 7, and dried at room temperature, and then the masking tape was removed. Then, the laminate was subjected to heat treatment at 170° C. for 10 minutes.

Then, this laminate was thoroughly washed in chloroform to dissolve and romove the polycarbonate, then washed with acetone and water, and subjected to electroless plating in the same manner as in Example 1, whereby a glass-cloth epoxy resin laminate uniformly plated with chemical copper only at the desired plating portions coated with the polymer composition, was obtained.

EXAMPLE 12

0.01 part by weight of di-η-chlor-bis(μ-2-methylallyl)dipalladium (II) was mixted to 100 parts by weight of the solid content of a commercially available alkaline-soluble through hole filling ink (SER-490WS, manufactured by Sanei Kagaku K.K.) to obtain a polymer composition containing an organic metal complex.

Figure 2:
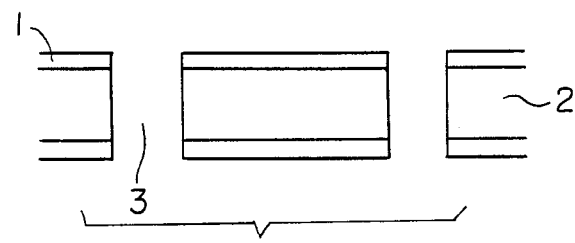

At the predetermined positions of a glass-cloth epoxy resin laminate having a thickness of 1.6 mm and having a copper foil 2 on each side of the laminate 1 as shown in FIG. 1, through holes 3 having diameters of 0.6 mm and 1.5 mm, respectively, were provided, as shown in FIG. 2.

The above-mentioned polymer composition was filled in the through holes by means of a roll coater, and the polymer composition was completely removed from each side of the laminate by means of an urethane squeegee having a hardness of 70°.

Figure 3:
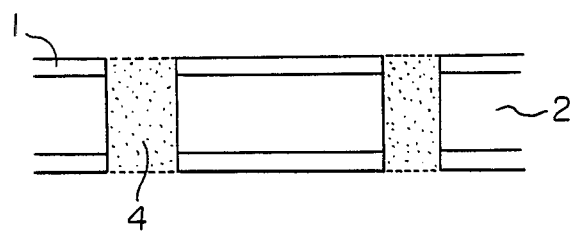

As a result, the above-mentioned polymer composition 4 was filled in the through holes, as shown in FIG. 3.

Figure 4:
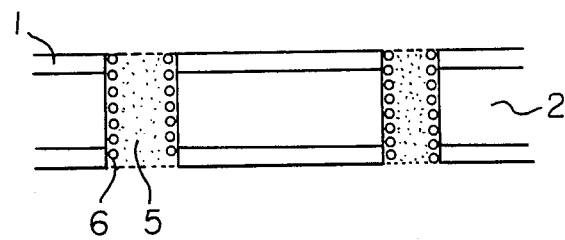

Then, this laminate was subjected to heat treatment at 120° for 80 minutes, whereby the polymer composition constituted the dried filler 5 and plating catalysist palladium metal nuclei 6 deposited on the inner walls of the through holes, as shown in FIG. 4.

Figure 5:
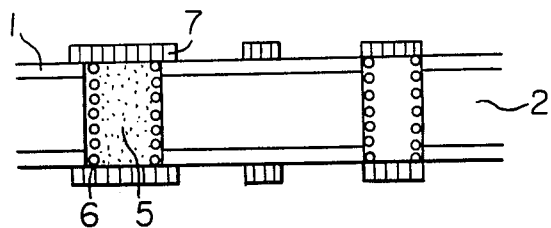

Then, as shown in FIG. 5, a pattern was drawn on the copper foil with an alkaline-soluble etching resist 7 (SER-420-31, manufactured by Sanei Kagaku K.K.), followed by drying.

Figure 6:
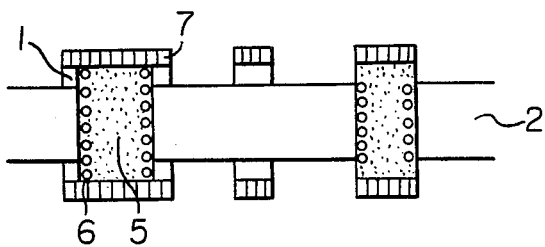

Further, as shown in FIG. 6, the copper portion where no pattern was drawn, was removed with a saturated aqueous solution of ferric chloride, and thoroughly washed with water.

Figure 7:
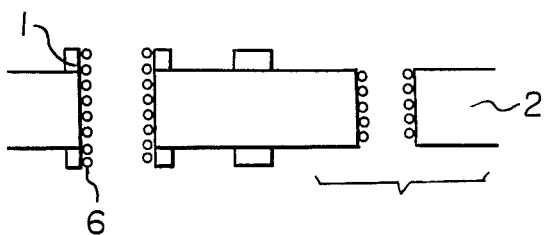

Then, as shown in FIG. 7, the etching resist and the dried filler in the through holes were dissolved and removed by the immersion in a 2% sodium hydroxide aqueous solution at 40° C., followed by washing with water, whereby a laminate having a copper foil pattern and having plating catalyst palladium metal nuceli 7 deposited in the through holes, was obtained.

Figure 8:
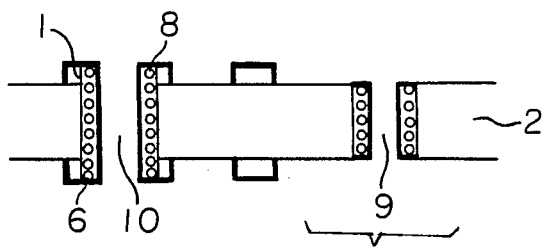

Then, the electroless plating was conducted in the same manner as in Example 1, whereby a glass-cloth epoxy resin laminate uniformly plated with chemical copper 8 both on the copper foil pattern and in the through holes, was obtained as shown in FIG. 8.

Bia holes 9 and through holes 10 in this glass-cloth epoxy resin laminate, were electrically conductive.

EXAMPLE 13

The polymer composition containing the organic metal complex of Example 12 comprising an alkaline-soluble through hole filling ink (SER-490WS, manufactured by Sanei Kagaku K.K.) and di-η-chloro-bis(μ-2-methylallyl)dipalladium (II), was applied in the same manner as in Example 13 to the commercially available glass-cloth epoxy resin laminate having a thickness of 1.6 mm and provided with four sets of 50 through holes having diameters of 0.6 mm, 0.8 mm, 1.8 mm and 2.5 mm, respectively, and then subjected to heat treatment at 120° C. for 80 minutes.

Then, the substrate was dipped in a 2% sodium hydroxide aqueous solution at 40° C., and washed with water. Then, the electroless plating was conducted in the same manner as in Example 1, whereby a glass-cloth epoxy resin laminate uniformly plated with chemical copper only in the through holes was obtained.

All the through holes in this glass-cloth epoxy resin laminate were electrically conductive.

We claim:

1. An electroless plating method which comprises applying to a substrate a polymer composition consisting essentially of 100 parts by weight of a polymer and an organic metal complex in an amount of from 0.001 to 50 parts by weight as metal, pyrolytically decomposing the organic metl complex at a temperature of from 80° to 350° C. to form plating catalyst metal nuclei on the substrate without decomposing the polymer, removing the dried polymer coating by using an organic solvent and/or an aqueous alkaline solution, and conducting electroless plating of the substrate.

2. The electroless plating method according to claim 1, wherein the plating catalyst metal nuclei are of a metal selected from the group consisting of metals of Groups Ib and VIII of the Periodic Law Table.

3. The elctroless plating method according to claim 1, wherein the plating catalyst metal nuclei are of a metal selected from the group consisting of cobalt, nickel, palladium, copper and platinum.

4. The eletroless plating method according to claim 1, wherein the ligand of the organic metal complex is at least one ligand selected from the group consisting of a tertiary phosphine, a tertiary phosphite, carbon monoxide, a straight chain or cyclic olefin, a conjugated olefin, an aryl compound, an organic cyano compound, an organic isonitrile compound, a carbonyl compound, an organic mercapto compound, a heterocyclic compound, a compound having an alkyl group, a vinyl group, an allyl group, an aryl group, an ethylidyne group, an acyl group, an acyloxy group or an amino group, a halogen atom, an oxygen atom and a nitrogen atom.

5. The electroless plating method according to claim 1, wherein the polymer is selected from the group consisting of polystyrene, polyvinyl chloride, polysulfone, polycarbonate, polyacrylate, polyurethane, polyamide, a saturated or unsaturated polyester, an epoxy resin, a silicon resin, a diallyl phthalate resin, a cellulosic plastic, a rosin-modified maleic acid resin, and copolymers thereof.

6. The electroless plating method according to claim 1, wherein the substrate is made of a material selected from the group consisting of plastics, glass, ceramics, wood, cellulose, paper and metal.

* * * * *